US011069526B2

(12) United States Patent
Lee et al.

(10) Patent No.: US 11,069,526 B2
(45) Date of Patent: Jul. 20, 2021

(54) USING A SELF-ASSEMBLY LAYER TO FACILITATE SELECTIVE FORMATION OF AN ETCHING STOP LAYER

(71) Applicant: Taiwan Semiconductor Manufacturing Co., Ltd., Hsinchu (TW)

(72) Inventors: Shao-Kuan Lee, Kaohsiung (TW); Hsin-Yen Huang, New Taipei (TW); Yung-Hsu Wu, Taipei (TW); Cheng-Chin Lee, Hsinchu (TW); Hai-Ching Chen, Hsinchu (TW); Shau-Lin Shue, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/171,436

(22) Filed: Oct. 26, 2018

(65) Prior Publication Data
US 2020/0006060 A1 Jan. 2, 2020

Related U.S. Application Data

(60) Provisional application No. 62/690,543, filed on Jun. 27, 2018.

(51) Int. Cl.
*H01L 23/48* (2006.01)
*H01L 21/02* (2006.01)
(Continued)

(52) U.S. Cl.
CPC .. *H01L 21/02304* (2013.01); *H01L 21/76802* (2013.01); *H01L 21/76877* (2013.01); *H01L 23/5222* (2013.01); *H01L 23/5226* (2013.01)

(58) Field of Classification Search
CPC ......... H01L 21/02304; H01L 21/76877; H01L 23/5222; H01L 23/5226
(Continued)

(56) References Cited

U.S. PATENT DOCUMENTS 6,788,477 B2 9/2004 Lin
7,605,472 B2 * 10/2009 Lee .................. H01L 21/76807
257/760
(Continued)

FOREIGN PATENT DOCUMENTS

CN 107431028 A 12/2017
KR 20070085814 8/2007
KR 20160130165 11/2016

*Primary Examiner* — Tan N Tran
(74) *Attorney, Agent, or Firm* — Haynes and Boone, LLP

(57) ABSTRACT

A structure is provided that includes a first conductive component and a first interlayer dielectric (ILD) that surrounds the first conductive component. A self-assembly layer is formed on the first conductive component but not on the first ILD. A first dielectric layer is formed over the first ILD but not over the first conductive component. A second ILD is formed over the first conductive component and over the first ILD. An opening is etched in the second ILD. The opening is at least partially aligned with the first conductive component. The first dielectric layer protects portions of the first ILD located therebelow from being etched. The opening is filled with a conductive material to form a second conductive component in the opening.

20 Claims, 12 Drawing Sheets

(51) Int. Cl.
  *H01L 21/768* (2006.01)
  *H01L 23/522* (2006.01)
(58) Field of Classification Search
  USPC .................................................. 257/701, 774
  See application file for complete search history.

(56) References Cited

U.S. PATENT DOCUMENTS

| | | | |
|---|---|---|---|
| 7,799,693 | B2 | 9/2010 | Soda |
| 7,986,040 | B2 * | 7/2011 | Bartsch ............. H01L 21/76805 257/751 |
| 8,003,518 | B2 * | 8/2011 | Haneda ............. H01L 21/76864 438/627 |
| 8,039,179 | B2 | 10/2011 | Shieh et al. |
| 8,199,314 | B2 | 6/2012 | Peng et al. |
| 8,202,680 | B2 | 6/2012 | Chang |
| 8,202,681 | B2 | 6/2012 | Lin et al. |
| 8,208,116 | B2 | 6/2012 | Lin et al. |
| 8,216,767 | B2 | 7/2012 | Wang et al. |
| 8,253,922 | B2 | 8/2012 | Lin et al. |
| 8,264,662 | B2 | 9/2012 | Chen et al. |
| 8,323,870 | B2 | 12/2012 | Lee et al. |
| 8,330,276 | B2 * | 12/2012 | Oda .................. H01L 21/76808 257/758 |
| 8,383,322 | B2 | 2/2013 | Chang et al. |
| 8,415,091 | B2 | 4/2013 | Chang |
| 8,464,186 | B2 | 6/2013 | Wang et al. |
| 8,468,473 | B1 | 6/2013 | Wang et al. |
| 8,473,877 | B2 | 6/2013 | Wang et al. |
| 8,507,159 | B2 | 8/2013 | Wang et al. |
| 8,510,687 | B1 | 8/2013 | Liu et al. |
| 8,524,427 | B2 | 9/2013 | Shin et al. |
| 8,527,916 | B1 | 9/2013 | Chiang et al. |
| 8,530,121 | B2 | 9/2013 | Wang et al. |
| 8,563,224 | B1 | 10/2013 | Chen et al. |
| 8,564,759 | B2 | 10/2013 | Chang et al. |
| 8,572,520 | B2 | 10/2013 | Chou et al. |
| 8,580,117 | B2 | 11/2013 | Kao et al. |
| 8,584,057 | B2 | 11/2013 | Liu et al. |
| 8,589,828 | B2 | 11/2013 | Lee et al. |
| 8,589,830 | B2 | 11/2013 | Chang et al. |
| 8,601,407 | B2 | 12/2013 | Wang et al. |
| 8,609,308 | B1 | 12/2013 | Chen et al. |
| 8,627,241 | B2 | 1/2014 | Wang et al. |
| 8,628,897 | B1 | 1/2014 | Lu et al. |
| 8,631,360 | B2 | 1/2014 | Wang et al. |
| 8,631,361 | B2 | 1/2014 | Feng |
| 8,658,344 | B2 | 2/2014 | Wang et al. |
| 8,677,511 | B2 | 3/2014 | Wang et al. |
| 8,679,707 | B2 | 3/2014 | Lee et al. |
| 8,691,476 | B2 | 4/2014 | Yu et al. |
| 8,709,682 | B2 | 4/2014 | Chen et al. |
| 8,715,890 | B2 | 5/2014 | Tu et al. |
| 8,715,919 | B2 | 5/2014 | Chang et al. |
| 8,716,841 | B1 | 5/2014 | Chang et al. |
| 8,722,286 | B2 | 5/2014 | Yu et al. |
| 8,728,332 | B2 | 5/2014 | Lin et al. |
| 8,732,626 | B2 | 5/2014 | Liu et al. |
| 8,736,084 | B2 | 5/2014 | Cheng et al. |
| 8,739,080 | B1 | 5/2014 | Tsai et al. |
| 8,741,551 | B2 | 6/2014 | Wu et al. |
| 8,745,550 | B2 | 6/2014 | Cheng et al. |
| 8,751,976 | B2 | 6/2014 | Tsai et al. |
| 8,753,788 | B1 | 6/2014 | Yu et al. |
| 8,762,900 | B2 | 6/2014 | Shin et al. |
| 8,764,995 | B2 | 7/2014 | Chang et al. |
| 8,765,330 | B2 | 7/2014 | Shih et al. |
| 8,765,582 | B2 | 7/2014 | Hsu et al. |
| 8,767,178 | B2 | 7/2014 | Lin et al. |
| 8,785,084 | B2 | 7/2014 | Lu et al. |
| 8,802,354 | B2 | 8/2014 | Chang |
| 8,812,999 | B2 | 8/2014 | Liu et al. |
| 8,822,106 | B2 | 9/2014 | Wang et al. |
| 8,822,243 | B2 | 9/2014 | Yan et al. |
| 8,828,625 | B2 | 9/2014 | Lu et al. |
| 8,828,632 | B2 | 9/2014 | Wang et al. |
| 8,835,082 | B2 | 9/2014 | Chen et al. |
| 8,837,810 | B2 | 9/2014 | Chen et al. |
| 8,841,047 | B2 | 9/2014 | Yu et al. |
| 8,841,049 | B2 | 9/2014 | Wang et al. |
| 8,841,058 | B2 | 9/2014 | Chang |
| 8,846,278 | B2 | 9/2014 | Shin et al. |
| 8,850,366 | B2 | 9/2014 | Liu et al. |
| 8,877,409 | B2 | 11/2014 | Hsu et al. |
| 9,385,129 | B2 * | 7/2016 | Kang ................ H01L 21/31116 |
| 9,502,256 | B2 * | 11/2016 | Ahn ...................... C23C 16/308 |
| 2006/0091468 | A1 | 5/2006 | Liaw |
| 2006/0105570 | A1 | 5/2006 | Hautala et al. |
| 2007/0252280 | A1 * | 11/2007 | Shimizu ............ H01L 21/76801 257/758 |
| 2011/0281208 | A1 | 11/2011 | Lin et al. |
| 2012/0034558 | A1 | 2/2012 | Chang |
| 2012/0045192 | A1 | 2/2012 | Peng et al. |
| 2012/0180823 | A1 | 7/2012 | Peng et al. |
| 2012/0236276 | A1 | 9/2012 | Lin et al. |
| 2012/0278776 | A1 | 11/2012 | Lei et al. |
| 2012/0308112 | A1 | 12/2012 | Hu et al. |
| 2012/0320351 | A1 | 12/2012 | Lin et al. |
| 2013/0201461 | A1 | 8/2013 | Huang et al. |
| 2013/0202992 | A1 | 8/2013 | Chen et al. |
| 2013/0216949 | A1 | 8/2013 | Chang |
| 2013/0258304 | A1 | 10/2013 | Chang et al. |
| 2013/0267047 | A1 | 10/2013 | Shih et al. |
| 2013/0295769 | A1 | 11/2013 | Lin et al. |
| 2013/0309611 | A1 | 11/2013 | Chang et al. |
| 2013/0320451 | A1 | 12/2013 | Liu et al. |
| 2013/0323641 | A1 | 12/2013 | Chang |
| 2014/0011133 | A1 | 1/2014 | Liu et al. |
| 2014/0017615 | A1 | 1/2014 | Chang |
| 2014/0017616 | A1 | 1/2014 | Chang |
| 2014/0065843 | A1 | 3/2014 | Chang et al. |
| 2014/0101624 | A1 | 4/2014 | Wu et al. |
| 2014/0109026 | A1 | 4/2014 | Wang et al. |
| 2014/0111779 | A1 | 4/2014 | Chen et al. |
| 2014/0117563 | A1 | 5/2014 | Yu et al. |
| 2014/0119638 | A1 | 5/2014 | Chang et al. |
| 2014/0120459 | A1 | 5/2014 | Liu et al. |
| 2014/0123084 | A1 | 5/2014 | Tang et al. |
| 2014/0134759 | A1 | 5/2014 | Lin et al. |
| 2014/0186773 | A1 | 7/2014 | Chang |
| 2014/0193974 | A1 | 7/2014 | Lee et al. |
| 2014/0215421 | A1 | 7/2014 | Chen et al. |
| 2014/0226893 | A1 | 8/2014 | Lo et al. |
| 2014/0242794 | A1 | 8/2014 | Lin et al. |
| 2014/0253901 | A1 | 9/2014 | Zhou et al. |
| 2014/0255850 | A1 | 9/2014 | Chang et al. |
| 2014/0256067 | A1 | 9/2014 | Cheng et al. |
| 2014/0257761 | A1 | 9/2014 | Zhou et al. |
| 2014/0264760 | A1 | 9/2014 | Chang et al. |
| 2014/0264899 | A1 | 9/2014 | Chang et al. |
| 2014/0272709 | A1 | 9/2014 | Liu et al. |
| 2014/0272726 | A1 | 9/2014 | Chang |
| 2014/0273442 | A1 | 9/2014 | Liu et al. |
| 2014/0273446 | A1 | 9/2014 | Huang et al. |
| 2014/0273521 | A1 | 9/2014 | Wu et al. |
| 2014/0282334 | A1 | 9/2014 | Hu et al. |
| 2015/0286146 | A1 | 10/2015 | Chang et al. |
| 2015/0309405 | A1 | 10/2015 | Shih et al. |
| 2015/0311075 | A1 | 10/2015 | Huang et al. |
| 2016/0322213 | A1 | 11/2016 | Thompson et al. |
| 2018/0026054 | A1 * | 1/2018 | Rui ..................... H01L 27/1222 257/71 |
| 2018/0112069 | A1 * | 4/2018 | Bai ........................ C08L 83/04 |

* cited by examiner

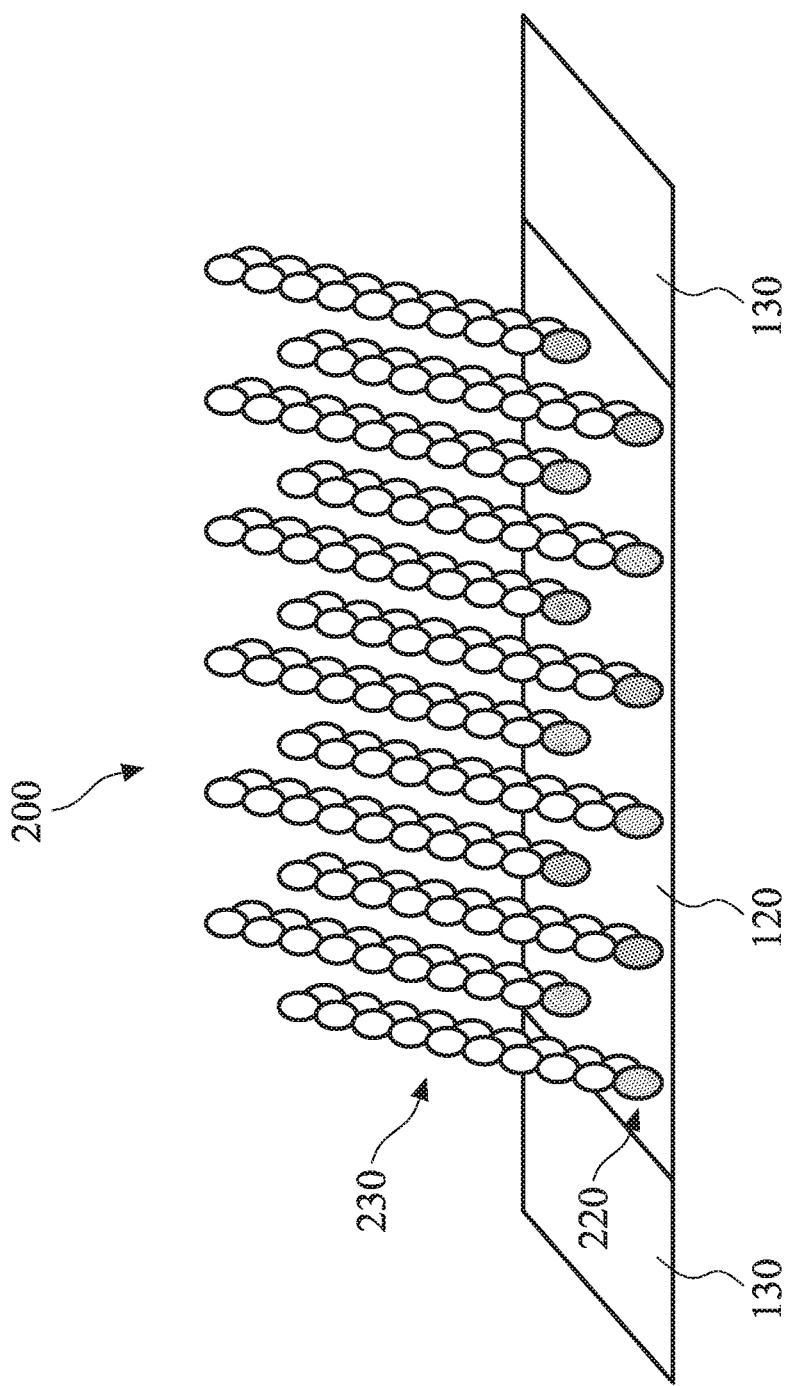

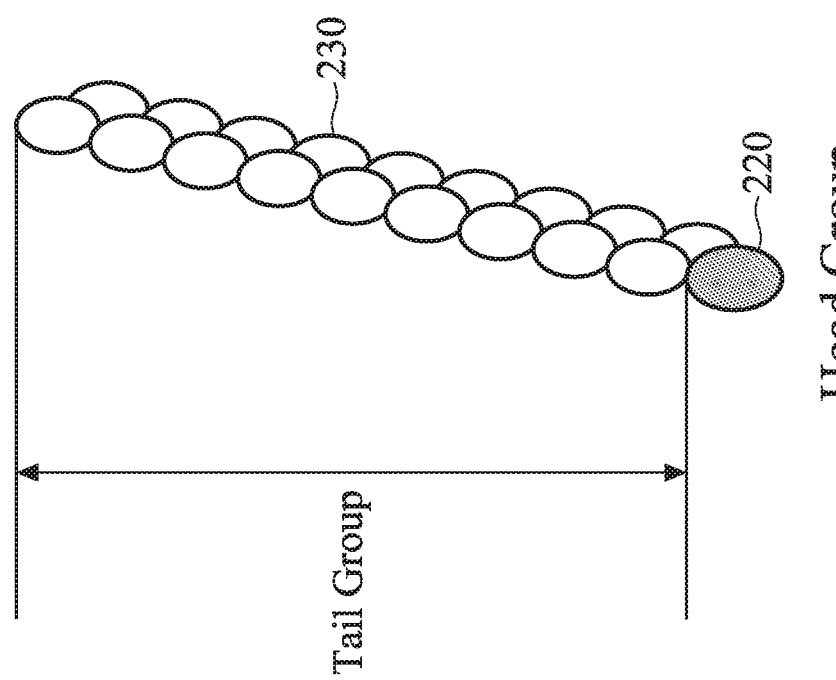

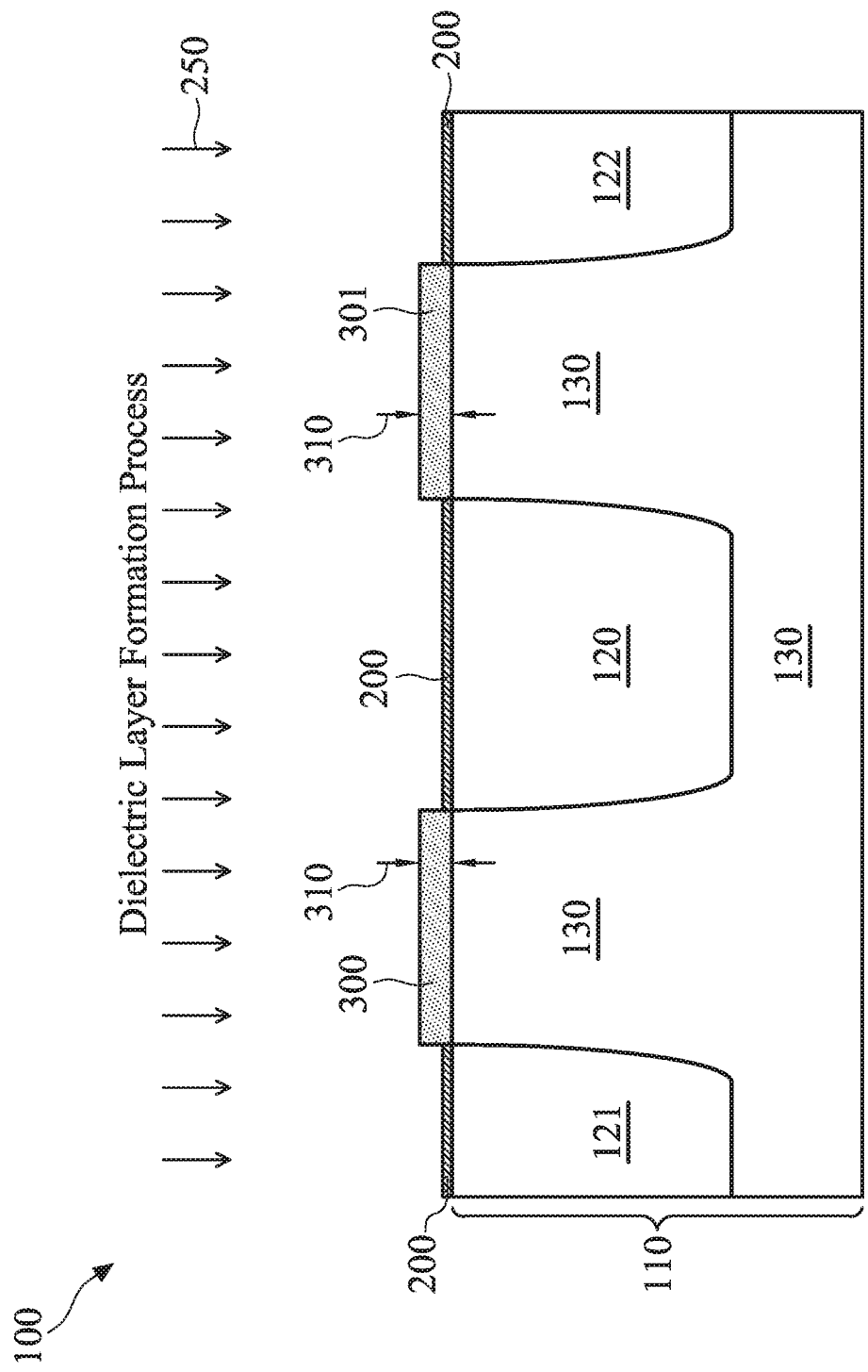

USING A SELF-ASSEMBLY LAYER TO FACILITATE SELECTIVE FORMATION OF AN ETCHING STOP LAYER

PRIORITY DATA

This application claims priority from U.S. Provisional Patent Application No. 62/690,543, entitled "Using a Self-Assembly Layer to Facilitate Selective Formation of an Etching Stop Layer" and filed on Jun. 27, 2018, the disclosure of which is incorporated herein in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

The decreased geometry sizes lead to challenges in semiconductor fabrication. For example, as geometry sizes continue to decrease, overlay control becomes more difficult, which could lead to reliability problems and/or degraded device performance. As another example, conventional devices may have excessive parasitic capacitance.

Therefore, while existing semiconductor devices and the fabrication thereof have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A-3B are perspective views of a self-assembly layer and a surface on which it is formed according to various embodiments of the present disclosure.

FIGS. 4-9 are cross-sectional views of a semiconductor device at various stages of fabrication according to embodiments of the present disclosure.

DETAILED DESCRIPTION

Figure 1:
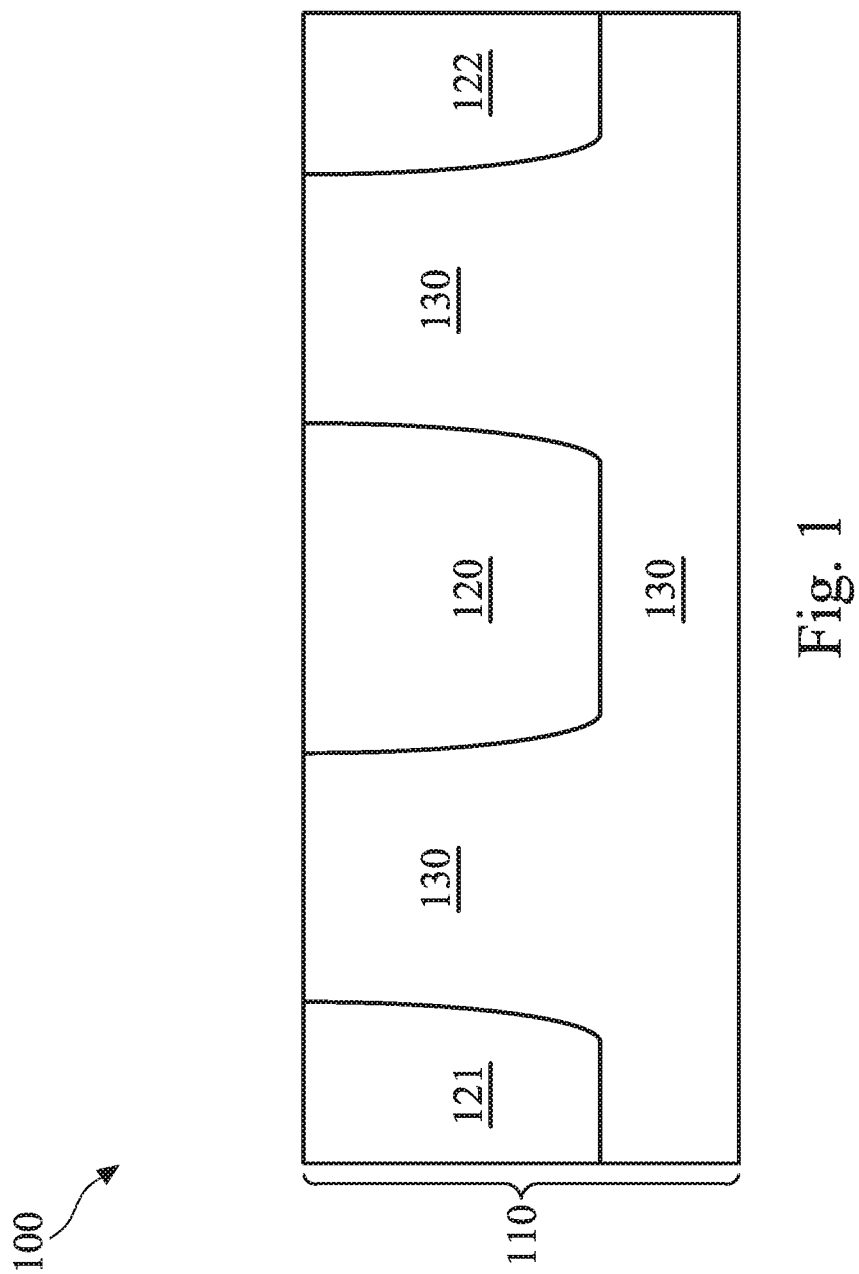
FIGS. 1-2 are cross-sectional views of a semiconductor device at various stages of fabrication according to embodiments of the present disclosure.

It is understood that the following disclosure provides many different embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the sake of simplicity and clarity and does not in itself dictate a relationship between the various embodiments and/or configurations discussed. Moreover, various features may be arbitrarily drawn in different scales for the sake of simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally directed to, but not otherwise limited to, reducing or preventing problems associated with overlay control. Overlay may refer to the alignment between various components of different layers in a semiconductor device such as an integrated circuit (IC) chip. For example, an IC chip may include an interconnect structure that is made up of a plurality of interconnect layers (also referred to as different metallization layers). Each interconnect layer may include one or more conductive components—such as vias, contacts, or metal lines—that are surrounded by an interlayer dielectric (ILD). In some instances, a conductive component (e.g. a metal line or a via) of one interconnect layer may need to be electrically connected to a conductive component (e.g., another via or another metal line) of another interconnect layer, and thus it is desirable for these two conductive components to be aligned vertically. If overlay control is unsatisfactory, there may be a significant amount of misalignment between the two conductive components, which could lead to problems such as over-etching of the ILD, which in turn could cause reliability and/or performance problems such as time-dependent dielectric breakdown (TDDB) or other leakage problems.

To overcome the problems discussed above, the present disclosure selectively forms a dielectric layer over an interconnect layer, such that the dielectric layer is formed on the upper surface of an interlayer dielectric (ILD) but not on the upper surface of conductive components (e.g., vias, contacts, or metal lines). This is achieved by first forming a self-assembly layer on the upper surfaces of the conductive components but not on the upper surface of the ILD. The self-assembly layer prevents the formation of the dielectric layer on the upper surfaces of the conductive components, for example by blocking the precursors of a deposition process (e.g., atomic layer deposition) used to form the dielectric layer. The dielectric layer, which is formed on the ILD but not on the conductive component, serves as an etching stop layer in a subsequent etching process that is performed to form a via hole that is supposed to be aligned with the conductive component.

As discussed above, in real world semiconductor fabrication, overlay control may not be optimal, particularly as geometry sizes shrink, which results in a misalignment between the via hole and the conductive component. Had the dielectric layer not been formed, the misalignment could have led to an undesirable etching of the ILD located below the via hole and adjacent to the conductive component. However, according to the various aspects of the present disclosure, the dielectric layer serves as an etching stop layer during the via hole etching process and protects the portions of ILD located therebelow from being etched. As such, the resulting semiconductor device has better reliability and/or enhanced performance.

In some embodiments, the present disclosure may form a stack comprising multiple dielectric layers over the ILD. The dielectric layers in the stack may have different material compositions, for example different dielectric constants. For example, a dielectric layer with a lower dielectric constant is formed at the bottom of the stack while a dielectric layer with a higher dielectric constant is formed at the top of the stack. The lower dielectric constant of the bottom layer may help reduce a total capacitance associated with the stack.

Figure 10:
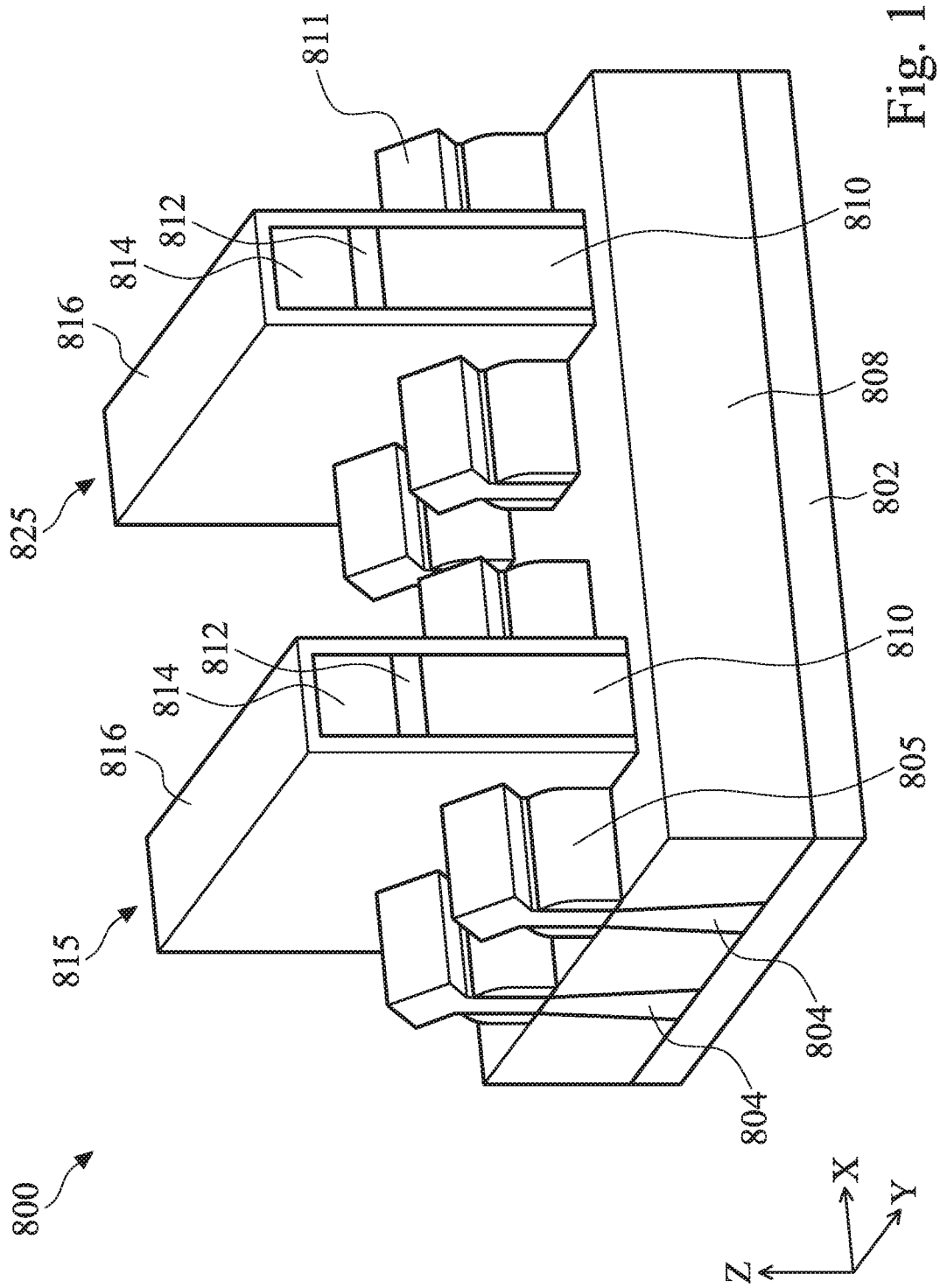
FIG. 10 is a perspective view of an example FinFET device.
Figure 11:
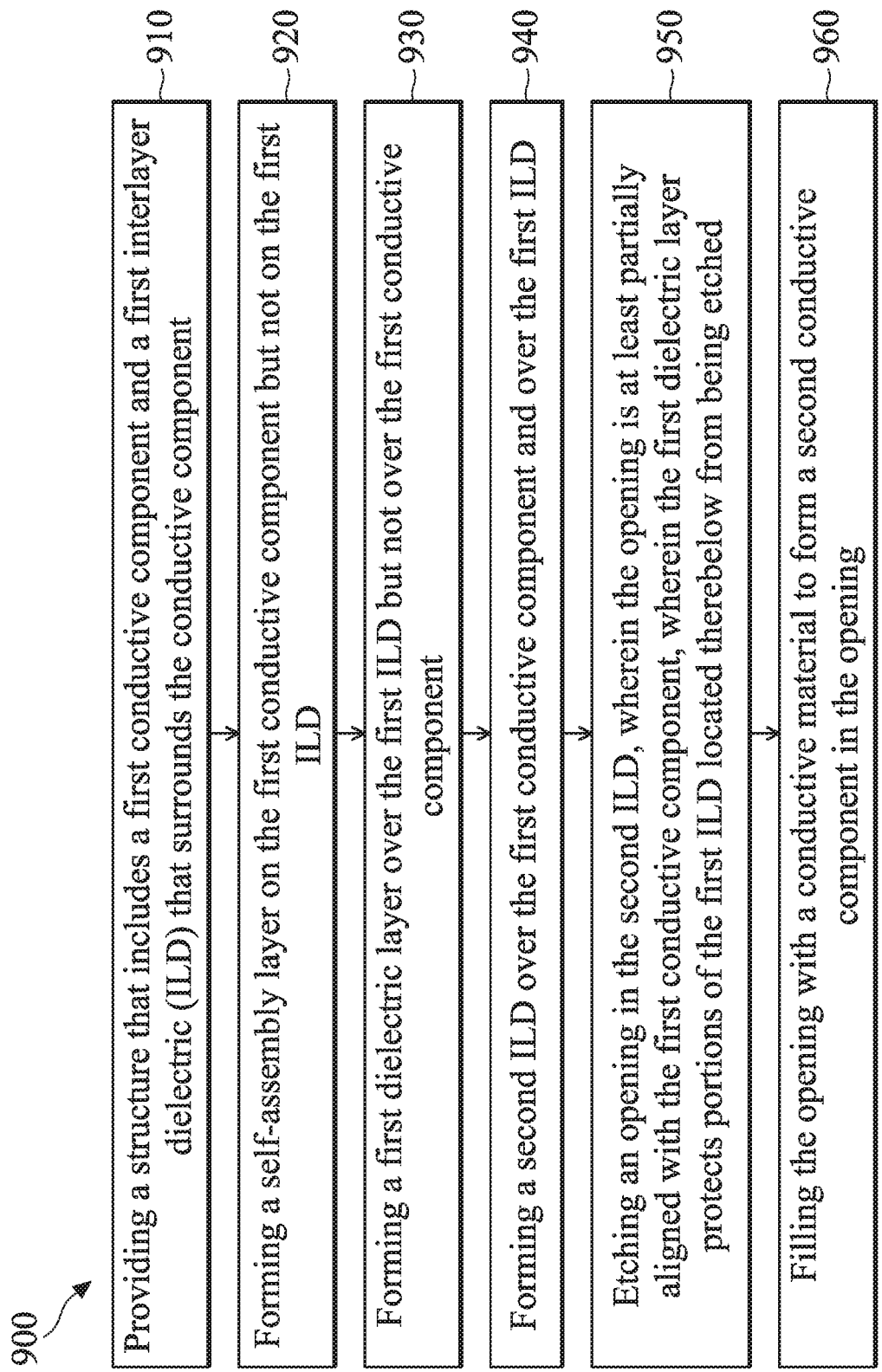
FIG. 11 is a flow chart of a method for fabricating a semiconductor device in accordance with embodiments of the present disclosure.

The various aspects of the present disclosure will now be discussed in more detail below with reference to FIGS. 1-11. In that regard, FIGS. 1-2 and 4-9 are diagrammatic fragmentary cross-sectional side views of a semiconductor device at different stages of fabrication according to embodiments of the present disclosure, FIGS. 3A-3B are perspective views of a self-assembly layer, FIG. 10 is perspective view of an example semiconductor device on which the aspects of the present disclosure may be implemented, and FIG. 11 is a flowchart illustrating a method performed according to embodiments of the present disclosure.

Referring now to FIG. 1, a portion of a semiconductor device 100 is illustrated. The semiconductor device 100 includes a substrate, which may be made of silicon or other semiconductor materials such as germanium. The substrate also may comprise a compound semiconductor such as silicon carbide, gallium arsenic, indium arsenide, or indium phosphide. In some embodiments, the substrate may comprise alloy semiconductor such as silicon germanium, silicon germanium carbide, gallium arsenic phosphide, or gallium indium phosphide. In some embodiments, the substrate may include an epitaxial layer, for example an epitaxial layer overlying a bulk semiconductor. Various microelectronic components may be formed in or on the substrate, such as transistor components such as source/drain or gate, or isolation structures such as shallow trench isolation (STI). Since the substrate and/or the microelectronic components formed therein or thereon are not the focus of the present disclosure, the substrate is not specifically illustrated herein for reasons of simplicity.

The semiconductor device 100 also include an interconnect layer 110. The interconnect layer 110 may be one of the interconnect layers in a multi-layered interconnect structure (MLI), which is formed over the aforementioned substrate and may include a plurality of patterned dielectric layers and conductive layers that provide interconnections (e.g., wiring) between the various microelectronic components of the semiconductor device 100.

In the illustrated embodiment, the interconnect layer 110 includes a plurality of conductive components such as conductive components 120-122 (note that the conductive components 121-122 are illustrated partially for reasons of simplicity), as well as an interlayer dielectric (ILD) 130 that surrounds the conductive components 120-122. The conductive components 120-122 may include contacts, vias, or metal lines. In some embodiments, the conductive components 120-122 comprise conductive materials such as aluminum, aluminum/silicon/copper alloy, titanium, titanium nitride, tungsten, polysilicon, metal silicide, or combinations thereof. Alternatively, the conductive components 120-122 may include copper, copper alloy, titanium, titanium nitride, tantalum, tantalum nitride, tungsten, polysilicon, metal silicide, or combinations thereof.

Meanwhile, the ILD 130 may include a low-k dielectric material (e.g., a dielectric material having a dielectric constant that is smaller than a dielectric constant of silicon dioxide, which is about 4). As non-limiting examples, the low-k dielectric material may include a porous organosilicate thin film such as SiOCH, tetraethylorthosilicate (TEOS) oxide, un-doped silicate glass, doped silicon oxide such as borophosphosilicate glass (BPSG), fused silica glass (FSG), phosphosilicate glass (PSG), fluorine-doped silicon dioxide, carbon-doped silicon dioxide, porous silicon dioxide, porous carbon-doped silicon dioxide, silicon carbon nitride (SiCN), silicon oxycarbide (SiOC), spin-on organic polymeric dielectrics, spin-on silicon based polymeric dielectrics, or combinations thereof. It is understood that a planarization process such as chemical mechanical polishing (CMP) may be performed to the interconnect layer 110 to flatten the upper surfaces of the conductive components 120-122 and the ILD 130.

Figure 2:
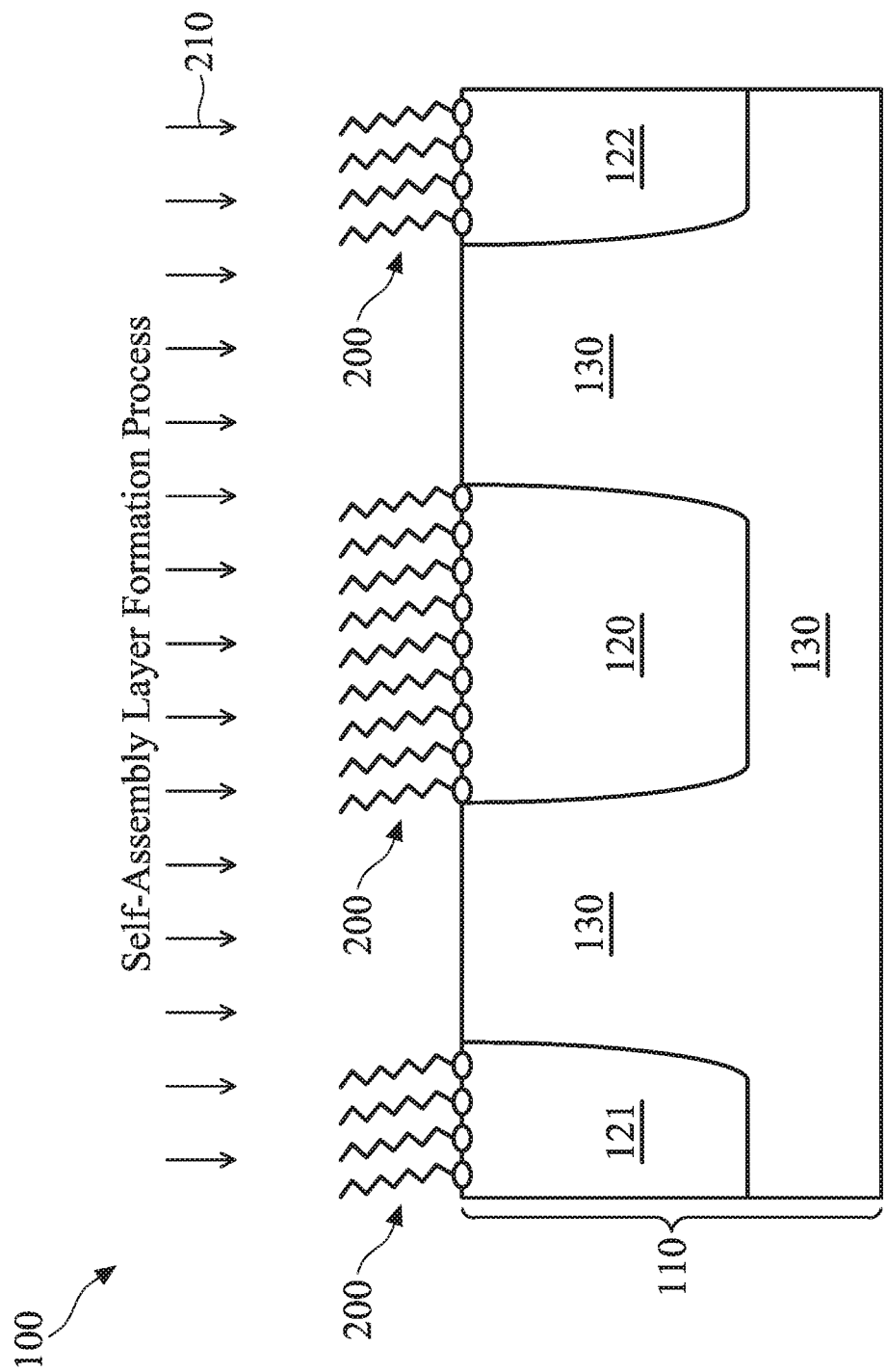

Referring now to FIG. 2, a self-assembly layer monolayer 200 (hereinafter referred to as a self-assembly layer) is formed selectively over portions of the interconnect layer 110. For example, using a self-assembly layer formation process 210, the self-assembly layer 200 is formed on the upper surfaces of the conductive components 120-122, but not on the upper surfaces of the ILD 130. In some embodiments, the self-assembly layer formation process 210 includes a chemical vapor deposition (CVD) process, a spin-on process, or a dipping process.

One reason for the selective formation of the self-assembly layer 200 (e.g., on the conductive components 120 but not on the ILD 130) is that the self-assembly layer 200 includes a head group (also referred to as an anchor) that is configured to bond with the surfaces of a certain material. For example, referring now to FIG. 3A, the self-assembly layer 200 is illustrated in greater detail in a simplified 3-dimensional perspective view. The self-assembly layer 200 is arranged into a plurality of strands, wherein each strand includes a head group 220 and a tail group 230 (also shown in FIG. 3B). The head group 220 has an affinity with a certain material's surface, so that it bonds to that surface. In this case, the head group 220 is configured to have affinity with a metal material but not with dielectric materials. As a result, the head group 220 bonds to the conductive component 120, which contains a metal material, but does not bond to the ILD, which contains a dielectric material and not a metal material. In some embodiments, the head group 220 may comprise phosphorous (P), sulfur (S), silicon (Si), or combinations thereof.

The tail group 230 is thermodynamically stable. Due to van-der Waals forces among them, the tail group 230 are arranged into orderly and separate strands of the self-assembly layer 200, where each strand extends in a vertically upward direction (though not necessarily perpendicularly) facing away from the upper surface of the conductive component 120. In some embodiments, the tail group 230 may comprise an organic material, for example a carbon chain (e.g., a methyl group).

Referring now to FIG. 4, a dielectric layer formation process 250 is performed to selectively form dielectric layers 300 and 301 over the upper surfaces of the semiconductor device 100. For example, the dielectric layers 300 and 301 are formed on the upper surfaces of the ILD 130, but not on the upper surfaces of the conductive components 120-122. The reason for the selective formation of the dielectric layers 300 and 301 is that the self-assembly layer 200—which is formed on the upper surfaces of the conductive components 120-122—prevents the formation of the dielectric layer 300 and 301 thereon. For example, the dielectric layer formation process 250 may include a deposition process in which one or more precursors are used. The precursors may include chemicals that react with a surface of the material on which the precursors are deposited. Through repeated exposures to the precursors, a thin film (such as the dielectric layers 300 and 301) may be slowly deposited. According to the various aspects of the present disclosure, however, the unique structure of the self-assembly layer 200 on the upper surfaces of the conductive components 120-122 "blocks" the precursors from being deposited thereon. As such, the precursors and in turn the entire dielectric layers 300 and 301—are formed over the ILD 130 but not over the conductive components 120-122.

In some embodiments, the dielectric layer formation process 250 includes an atomic layer deposition (ALD) process. In other embodiments, the dielectric layer formation process 250 may include a chemical vapor deposition (CVD) process, a spin-on process, or an electro-less plating process. The dielectric layers 300 and 301 may include a dielectric material that contains aluminum (Al), zirconium (Zr), yttrium (Y), hafnium (Hf), or combinations thereof. For example, the dielectric layers 300 and 301 may include aluminum oxide, zirconium oxide, yttrium oxide, hafnium oxide, or combinations thereof. The dielectric layers 300 and 301 have a relatively high dielectric constant, for example a dielectric constant that is greater than the dielectric constant of the ILD 130. In some embodiments where the dielectric layers 300 and 301 contain an aluminum-based dielectric, the dielectric constant of the dielectric layers 300 and 301 is greater than about 9. In some other embodiments where the dielectric layers 300 and 301 contain a zirconium-based dielectric, yttrium-based dielectric, or a hafnium-based dielectric, the dielectric constant of the dielectric layers 300 and 301 is greater than about 25.

The high dielectric constant of the dielectric layers 300 and 301 helps the dielectric layers 300-301 achieve an etching selectivity with an ILD (to be formed later) that has also has a low-k dielectric material like the ILD 130. For example, in an etching process to be performed later, the dielectric layers 300 and 301 and the low-k dielectric material should have substantially different etching rates. If the etching rate of the dielectric layers 300 and 301 is significantly smaller than the etching rate of the low-k dielectric material, the dielectric layers 300 and 301 would serve as an effective etching stop layer. The aspect of the dielectric layers 300 and 301 functioning as etching stop layers will be discussed in more detail below.

The dielectric layers 300 and 301 are also formed to each have a thickness 310. In some embodiments, the thickness 310 is greater than 0 nanometers (nm) but less than about 70 nm. In some embodiments, the thickness 310 is in a range between 0.1 nm and about 7 nm. This thickness range of the dielectric layers 300 and 301 is specifically tuned to allow the dielectric layers 300 and 301 to effectively serve as etching stop layers while not enlarging the size of the semiconductor device 100 unnecessarily or interfering with the subsequent fabrication steps.

In some embodiments, the self-assembly layer 200 is at least partially removed after the formation of the dielectric layers 300 and 301. For example, the tail group 230 of the self-assembly layer 200 may be removed using a thermal process (e.g., by heating the semiconductor device 100), or by a plasma treatment, or by an application of a chemical, such as a wet chemical that includes an aqueous solution or a solvent-based solution. In embodiments where the tail group 230 is removed, the head group 220 still remains on the conductive components, forming a stable phase capping layer. In some embodiments, the tail group 230 need not be specifically removed by a targeted process, but it may decompose during one or more subsequent processes.

Figure 5:
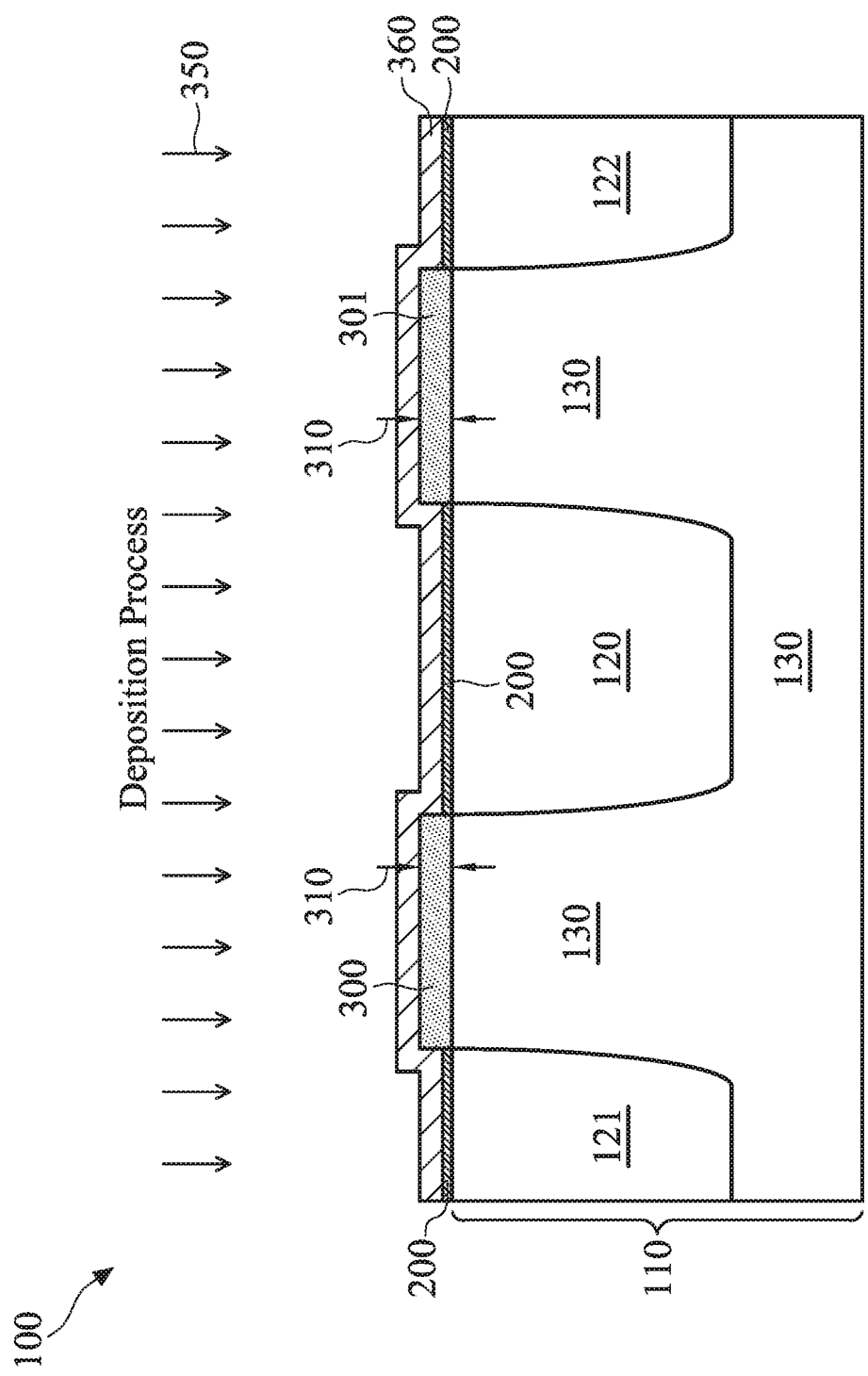

Referring now to FIG. 5, a deposition process 350 is performed to form an etching stop layer 360 over the semiconductor device 100. In some embodiments, the deposition process 350 may include a CVD process, a physical vapor deposition (PVD) process, an ALD process, or combinations thereof. The etching stop layer 360 may be formed conformally over the remaining portions of the self-assembly layer 200 and over the side surfaces and upper surfaces of the dielectric layers 300 and 301. In some embodiments, the etching stop layer 360 includes a dielectric material, for example a dielectric material that is different from the material of the dielectric layers 300 and 301. In some embodiments, the etching stop layer 360 serves purposes such as adhesion, metal oxidation prevention, metal damage prevention, and universal etching performance insurance.

Figure 6:
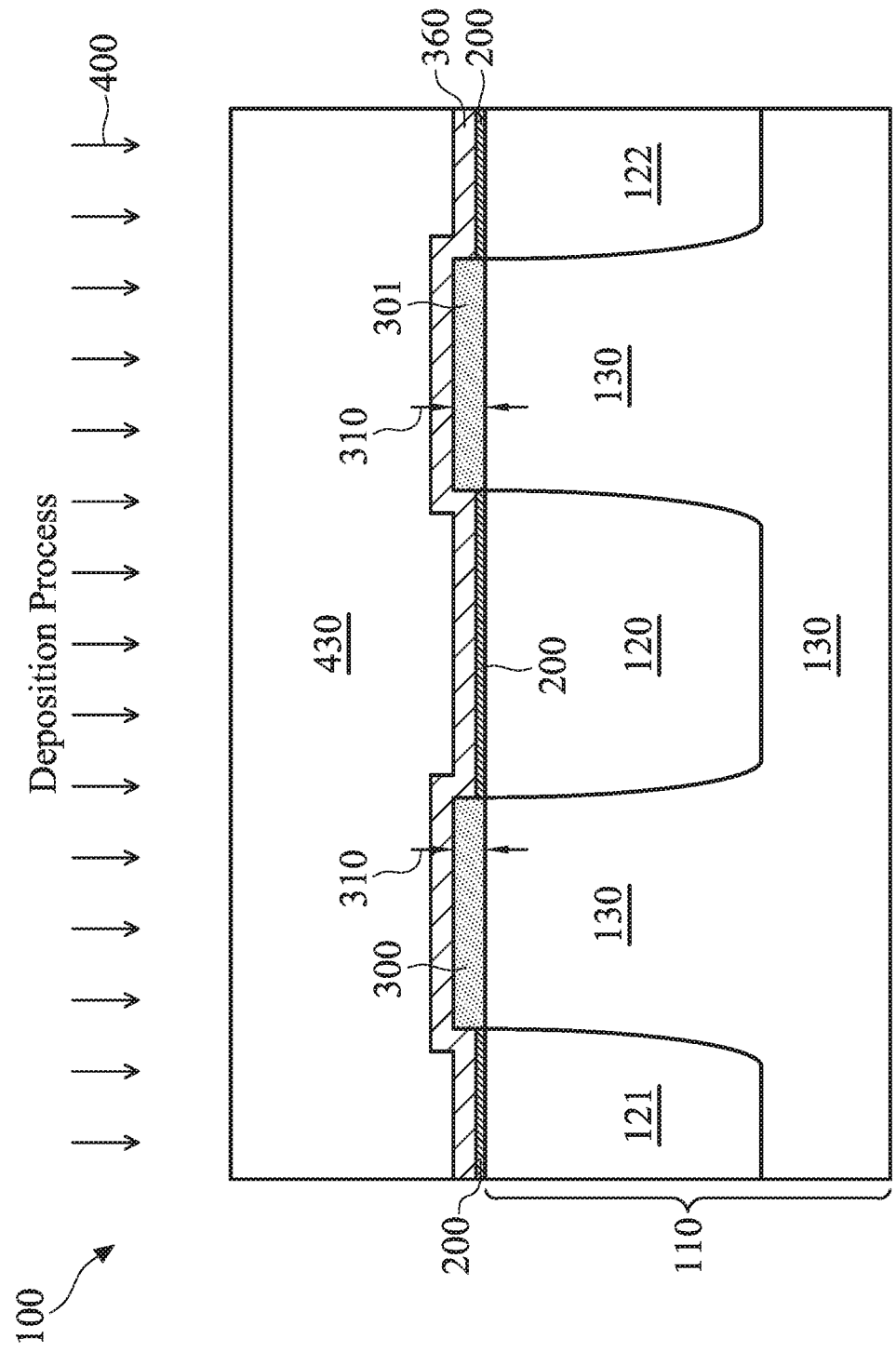

Referring now to FIG. 6, a deposition process 400 is performed to form another ILD 430 over the etching stop layer 360. The deposition process 400 may include a process such as CVD, PVD, ALD, or combinations thereof. In some embodiments, the ILD 430 may include a low-k dielectric material, such as SiOCH, TEOS, BPSG, FSG, etc. In some embodiments, the ILD 130 and the ILD 430 have the same material composition.

Figure 7:
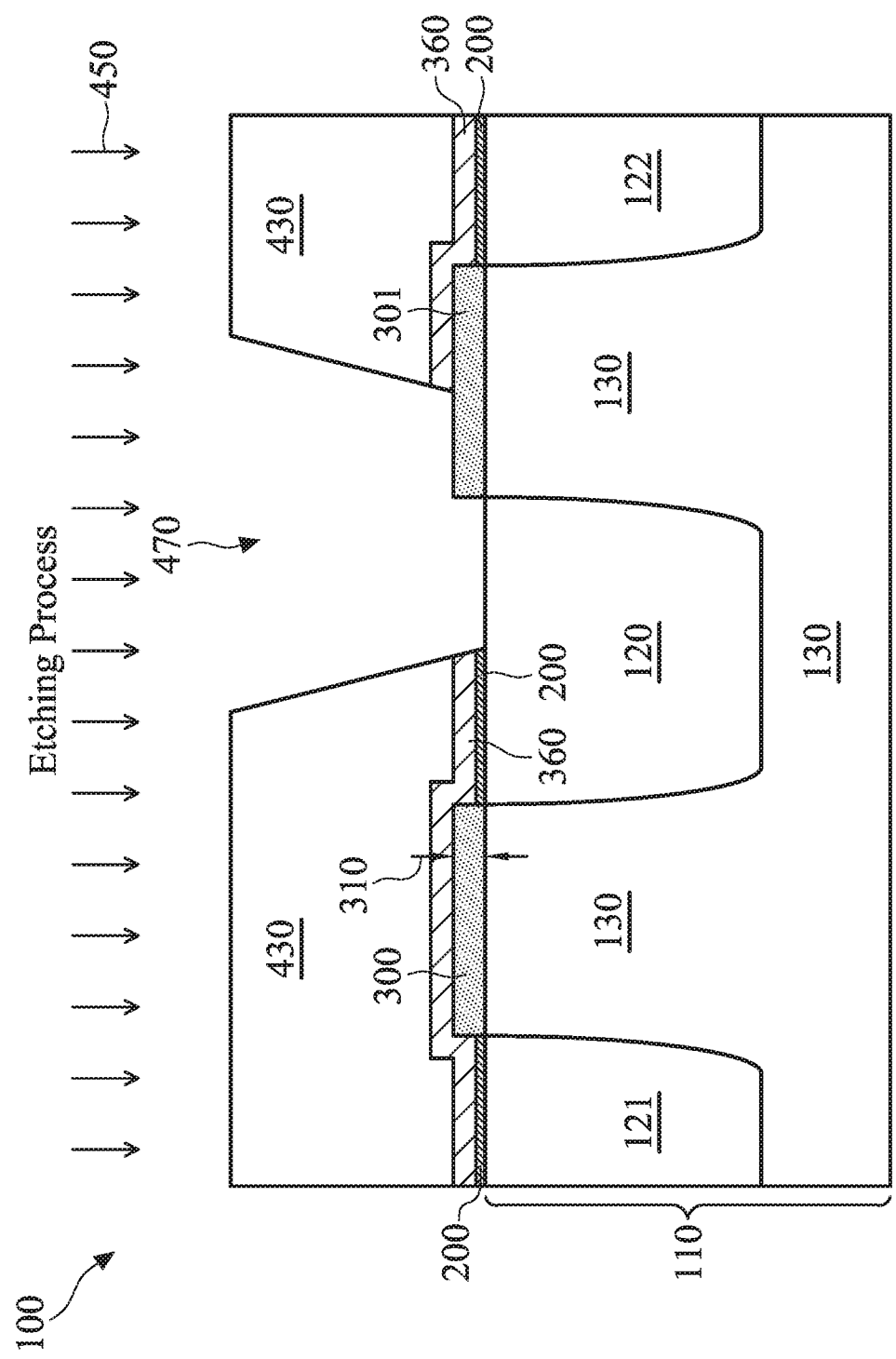

Referring now to FIG. 7, an etching process 450 is performed to etch an opening 470 in the ILD 430, which extends vertically through the ILD 430, the etching stop layer 360, and the self-assembly layer 200. The etching process 450 may include a wet etching process or a dry etching process. The opening 470 formed by the etching process 450 will be filled by a conductive material later, for example to form a conductive component such as a via or a metal line. Ideally, the opening 470 should be aligned with the conductive component 120, such that a good electrical connection can be established between the conductive component 120 and the conductive component formed in the opening 470.

However, as is often the case in real world semiconductor fabrication, the alignment between the opening 470 and the conductive component 120 is imperfect due to overlay control issues. This problem is further exacerbated as the geometry sizes shrink for each semiconductor technology node. Consequently, as shown in FIG. 7, a misalignment exists between the opening 470 and the conductive component 120, which is manifested as the opening 470 being shifted "to the right" such that the opening 470 is now located above a portion of the ILD 130. In conventional semiconductor devices, such a misalignment may have led to an undesirable etching of the portion of the ILD 130 located under the opening 470 as a result of the etching process 450. The over-etched portion of the ILD 130 would then be filled with the conductive material later when the conductive material fills the opening 470. This may cause problems such as time-dependent dielectric breakdown (TDDB) or leakage within the semiconductor device 100.

The present disclosure overcomes the problem discussed above by forming self-aligned dielectric layers 300 and 301 on the ILD 130, which serve as etching stop layers herein to prevent the potential over-etching of the ILD 130 caused by the etching process 450. In more detail, as shown in FIG. 7, the etched opening 470 vertically extends through the ILD 430 but stops at the dielectric layer 301. This is made possible by the etching selectivity between the dielectric materials of the dielectric layer 301 and the ILD 430. As discussed above, the material compositions of the dielectric layers 300-301 and the ILD 430 are configured such that a significant etching selectivity exists between them during the etching process 450. In some embodiments, the etching selectivity between the ILD 430 and the dielectric layer 301 is greater than about 7:1. That is, the etching rate for the ILD 430 is at least 7 times greater than the etching rate for the dielectric layer 301 during the etching process 450. As such, the ILD 430 may be substantially etched through without significantly affecting the dielectric layer 301, which allows the dielectric layer 301 to serve as an etching stop layer (or a protective layer) during the etching process 450. Since the dielectric layer 301 is preserved, the portion of the ILD 130 located below the dielectric layer 301 is also protected from being etched.

Figure 8:
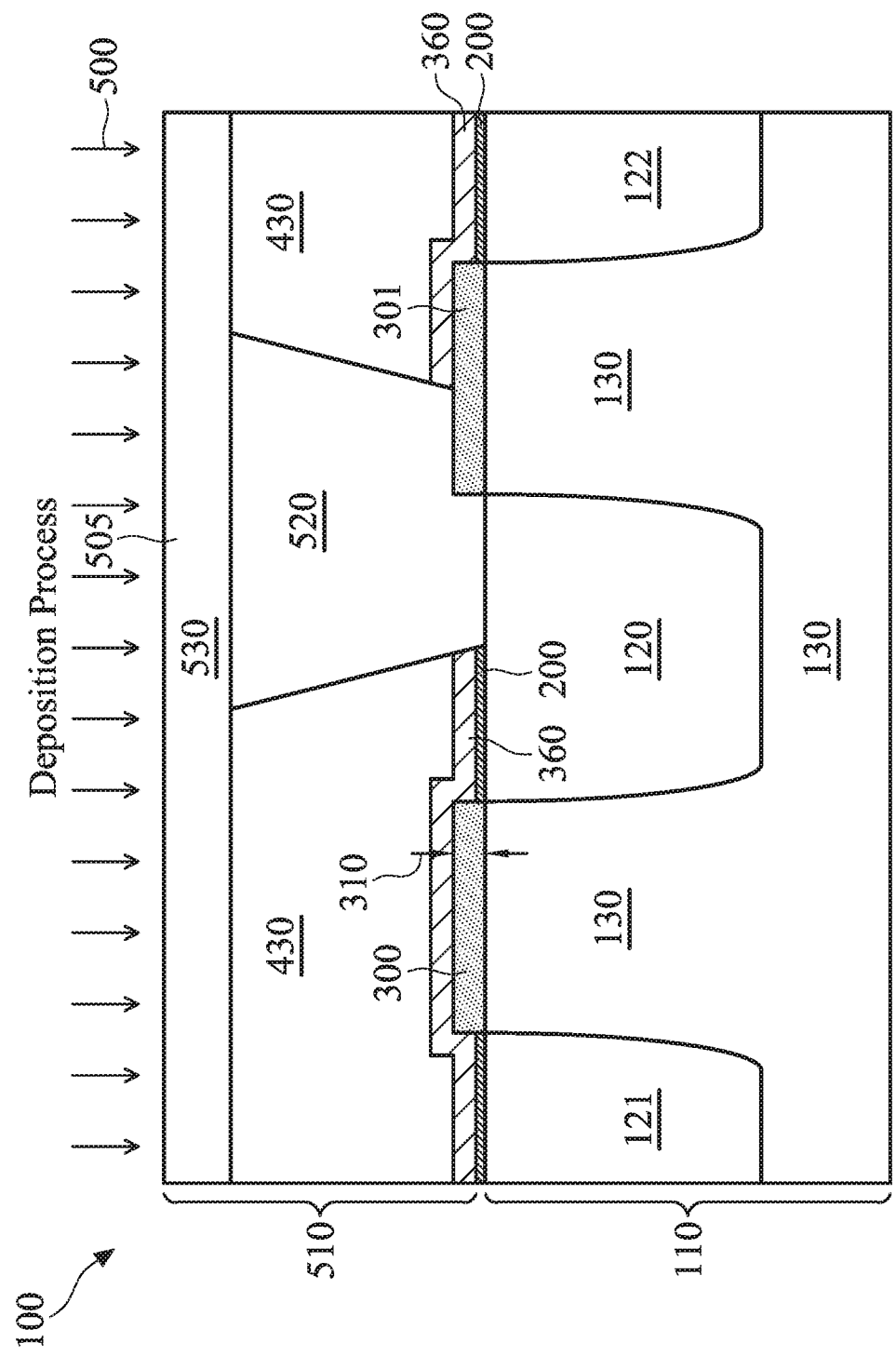

Referring now to FIG. 8, a deposition process 500 is performed to form a conductive material 505 over the semiconductor device 100. The deposition process 500 may include a process such as CVD, PVD, ALD, or combinations thereof. In some embodiments, the deposited conductive material 505 includes a metal or metal alloy such as copper, aluminum, tungsten, titanium, or combinations thereof. The deposited conductive material 505 and the ILD 430 may be considered portions of an interconnect layer 510 of the multi-layer interconnect structure, which is located above the interconnect layer 110. In some embodiments, the interconnect layer 110 is a $M_n$ (e.g., Metal-0) interconnect layer, and the interconnect layer 510 is a $M_{n+1}$ (Metal-1) interconnect layer.

A portion of the deposited conductive material 505 fills the opening 470 to form a conductive element 520, while another portion of the deposited conductive material 505 serves as a metal line 530 for the interconnect layer 510. In some embodiments, the conductive element 520 serves as a conductive via, which is electrically connected to the conductive element 120 below. Again, since the dielectric layer 301 serves as an etching stop layer during the etching of the via opening, the portion of the ILD 130 below the dielectric layer 301 is not etched. Therefore, the deposition process 500 will not inadvertently form a conductive material in the ILD 130, even if the conductive components 120 and 520 are misaligned due to an overlay shift. In some embodiments, a planarization process such as a CMP process may be performed to planarize an upper surface of the metal line 530.

Note that at this stage of fabrication, a remnant of the self-assembly layer 200 is still disposed on a portion of the conductive component 120 that is not directly under the conductive component 520. In other words, a portion of the self-assembly layer 200 exposed by the via hole is etched away during the etching process 450, but the portions of the self-assembly layer 200 trapped between the conductive component 120-122 and the etching-stop layer 360 are not affected by the etching process 450 and therefore remain detectable in the final structure of the semiconductor device 100. The presence of the self-assembly layer 200 is one of the unique physical characteristics of the present application and may indicate that the steps of the present disclosure discussed above have been performed.

Figure 9:
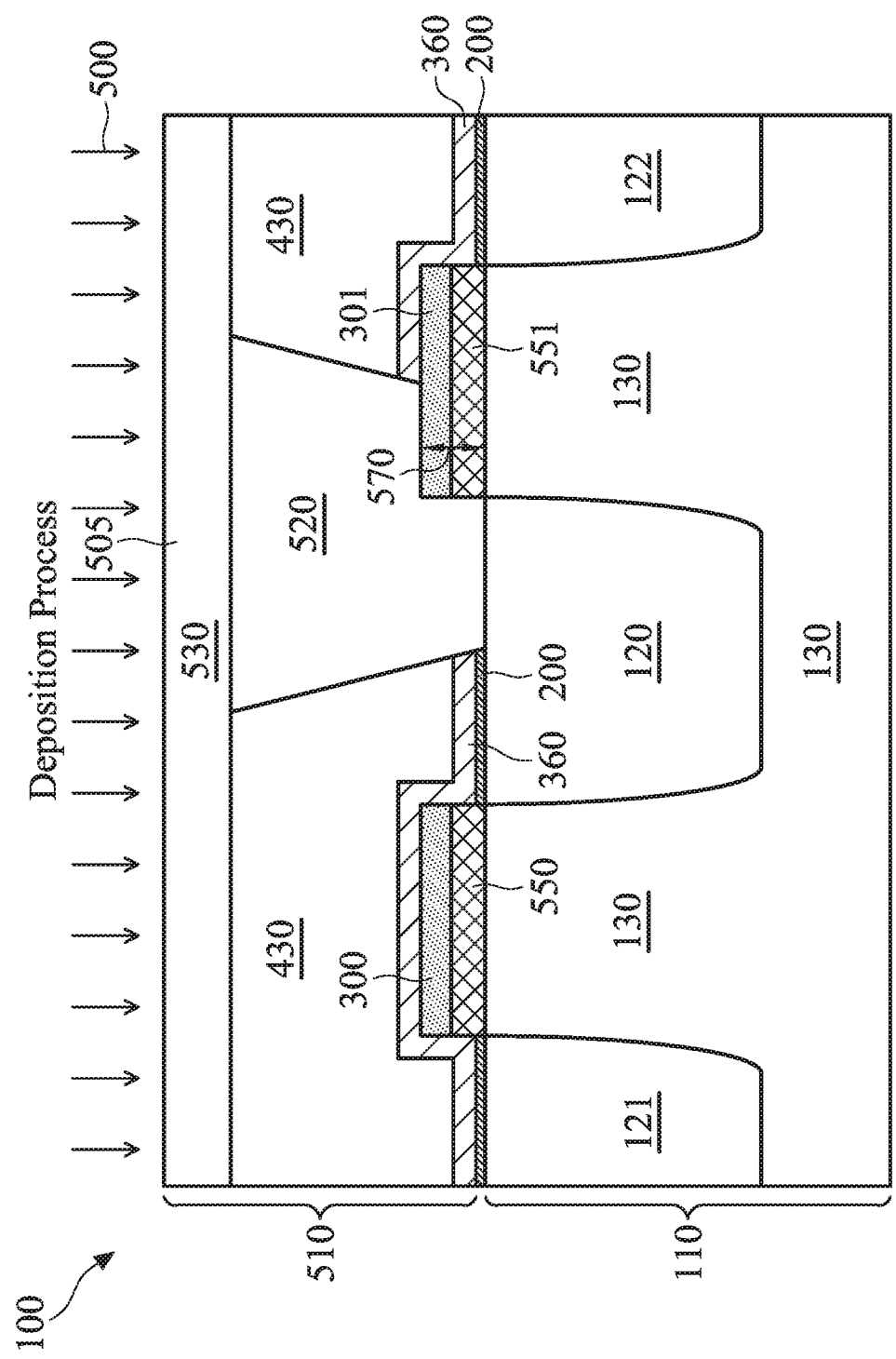

FIG. 9 illustrates an alternative embodiment of the present disclosure that further improves the embodiment shown in FIG. 8. For reasons of consistency and clarity, similar components appearing in FIGS. 8 and 9 are labeled the same. In the embodiment shown in FIG. 9, an extra dielectric layer 550 is formed between the ILD 130 and the dielectric layer 300, and an extra dielectric layer 551 is formed between the ILD 130 and the dielectric layer 301. For example, after the selective formation of the self-assembly layer 200 (selectively formed on the conductive components 120-122 but not on the ILD 130), a deposition process is performed to form the dielectric layers 550-551 on the upper surfaces of the ILD 130. The dielectric layers 550-551 are not formed on the upper surfaces of the conductive components 120-122 due to the presence of the self-assembly layer 200 on the upper surfaces of the conductive components 120-122. For example, the self-assembly layer 200 may "block" the precursors of the dielectric layers 550-551 from being deposited thereon. As such, the precursors—and in turn the entire dielectric layers 550-551—are formed over the ILD 130 but not over the conductive components 120-122.

Similar to the dielectric layers 300 and 301, the dielectric layers 550 and 551 may be formed by a process such as ALD, CVD, a spin-on process, or an electro-less plating process. The dielectric layers 550-551 may include a dielectric material that contains Si, O, C, or as a doped mixture with Al, Zr, Y, Hf, or combinations thereof. The dielectric layers 550-551 are configured to achieve a relatively low dielectric constant, for example a dielectric constant that is lower than the dielectric constant of the dielectric layers 300-301. In some embodiments, the dielectric constant of the dielectric layers 550 and 551 is less than about 6, for example between about 4 and 6. In some other embodiments, the dielectric constant of the dielectric layers 550 and 551 may be configured to be less than about 4.

One reason for forming the dielectric layers 550 and 551 is to lower the total parasitic capacitance of the semiconductor device 100. As discussed above, the dielectric layers 300 and 301 have a relatively high dielectric constant (e.g., greater than about 9 for Al-based dielectric materials or greater than about 25 for Hf-based dielectric materials). Such a high dielectric constant may increase a parasitic capacitance, which is positively correlated with dielectric constant. A high parasitic capacitance may degrade the performance of the semiconductor device 100, for example with respect to its speed and/or power consumption.

The present disclosure alleviates the high parasitic capacitance problem through the implementation of the dielectric layers 550 and 551. As discussed above, the dielectric layers 550 and 551 have a relatively low dielectric constant. As such, the contribution to the total parasitic capacitance from the dielectric layers 550 and 551 may be minimal. Furthermore, the presence of the dielectric layers 550 and 551 effectively "elevates" the dielectric layers 300 and 301. Although the dielectric layers 300 and 301 have a relatively high dielectric constant, their greater distance away from the ILD 130 (and from an electric field associated with the breakdown voltage) lessens the impact or contribution to the total parasitic capacitance from the dielectric layers 300 and 301. Consequently, the total parasitic capacitance is lowered.

After the dielectric layers 550 and 551 are selectively formed on the upper surfaces of the ILD 130, the dielectric layers 300 and 301 are formed on the dielectric layers 550 and 551, respectively. The self-assembly layer 200 still prevents the formation of the dielectric materials thereon (for example by blocking the precursors from being deposited thereon), and thus the dielectric layers 300-301 are formed on the dielectric layers 550-551, respectively, but not on the conductive components 120-122. The configuration of the dielectric layers 551 and 301 in FIG. 9 simultaneously achieves both a low parasitic capacitance (due to the low dielectric constant of the dielectric layer 551) and a high etching selectivity with the ILD 430 (due to the high dielectric constant of the dielectric layer 301).

As shown in FIG. 9, the dielectric layers 301 and 551 have a combined thickness 570. In some embodiments, the thickness 570 is in a range between about 0 nanometers and about 70 nanometers, for example between 0.1 nm and about 15 nm. In some embodiments, the thickness of the dielectric layer 551 is also greater than a thickness of the dielectric layer 301. These thicknesses are not arbitrary but are specifically configured to achieve a sufficiently low total parasitic capacitance without affecting the etching stop functionality of the dielectric layer 301.

The etching stop layer 360 is formed over the dielectric layers 300 and 301, as well as over the conductive components 120-122. Thereafter, the ILD 430 is formed, and the conductive component 520 is formed through an etching process to etch an opening in the ILD 430 and subsequently filling the etched opening with a conductive material, in a manner similar to that described above in association with FIGS. 6-8. Similar to the embodiment discussed above with reference to FIG. 8, at least the dielectric layer 301 will serve as an etching stop layer during the etching of the opening, so as to protect the ILD 130 located below from being etched. The dielectric layer 551 may also help protect the ILD 130 below during the etching process 450, but as discussed above, its etching selectivity with ILD 430 is not quite as high, and thus the primary function of the dielectric layer 551 is still to reduce parasitic capacitance, and serving as an etching stop layer is a secondary role for the dielectric layer 551.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

For the sake of providing an example, a perspective view of an example FinFET device structure 800 is illustrated in FIG. 10. The FinFET device structure 800 includes two example FinFETs 815 and 825. In some embodiments, the FinFET 815 may be an N-type FinFET and the FinFET 825 may be a P-type FinFET.

The FinFET device structure 800 includes a substrate 802. The substrate 802 may be made of silicon, germanium or other semiconductor materials. The FinFET device structure 800 also includes one or more fin structures 804 (e.g., Si fins) that extend from the substrate 802 in the Z-direction and surrounded by spacers 805 in the Y-direction. The fin structures 804 are each elongated in the X-direction and include a semiconductor material. The fin structure 804 may be formed by using suitable processes such as photolithography and etching processes. In some embodiments, the fin structure 804 is etched from the substrate 802 using dry etch or plasma processes. The fin structure 804 also includes an epi-grown material 811, which may (along with portions of the fin structure 804) serve as the source/drain regions of the FinFET device structure 800.

An isolation structure 808, such as a shallow trench isolation (STI) structure, is formed to surround the fin structure 804. A lower portion of the fin structure 804 is surrounded by the isolation structure 808, and an upper portion of the fin structure 804 protrudes from the isolation structure 808, as shown in FIG. 10. The isolation structure 808 prevents electrical interference or crosstalk.

The FinFET device structure 800 further includes a gate stack structure including a gate electrode 810 and a gate dielectric layer (not shown) below the gate electrode 810. The gate electrode 810 may include polysilicon or metal. Metal includes tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt), or other applicable materials. In some embodiments, the gate electrode 810 may be formed in a gate last process (or gate replacement process), in which a dummy polysilicon gate electrode is replaced by a metal gate electrode. Hard mask layers 812 and 814 may be used to define the gate electrode 810. A dielectric layer 816 may also be formed on the sidewalls of the gate electrode 810 and over the hard mask layers 812 and 814. Portions of the dielectric layer 816 may serve as gate spacers.

The gate dielectric layer (not shown) may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

It is understood that the gate stack structure may include additional layers, such as interfacial layers, capping layers, diffusion/barrier layers, or other applicable layers.

FIG. 11 is a flowchart of a method 900 for fabricating a semiconductor device in accordance with various aspects of the present disclosure. The method 900 includes a step 910 of providing a structure that includes a first conductive component and a first interlayer dielectric (ILD) that surrounds the conductive component.

The method 900 includes a step 920 of forming a self-assembly layer on the first conductive component but not on the first ILD. In some embodiments, the self-assembly layer is formed by depositing the self-assembly layer that includes a head group and a tail group. In some embodiments, the head group comprises phosphorous, sulfur, or silicon. In some embodiments, the tail group comprises an organic material, which may include a carbon chain, such as a methyl group. In some embodiments, the tail group is removed in a later fabrication process, for example by a thermal process, by a plasma treatment, or by an application of a chemical. In embodiments where the tail group is removed, the head group still remains on the conductive component as a capping layer.

The method 900 includes a step 930 of forming a first dielectric layer over the first ILD but not over the first conductive component. In some embodiments, the step 930 of forming the first dielectric layer comprises performing a deposition process using precursors. During the forming of the first dielectric layer, the self-assembly layer prevents the precursors from being formed on the first conductive component.

The method 900 includes a step 940 of forming a second ILD over the first conductive component and over the first ILD.

The method 900 includes a step 950 of etching an opening in the second ILD, wherein the opening is at least partially aligned with the first conductive component. The first dielectric layer protects portions of the first ILD located therebelow from being etched. In some embodiments, the etching step 950 is configured such that the second ILD has a substantially greater etching rate than the first dielectric layer. For example, the second ILD may have an etching rate that is at least 7 times greater than the etching rate of the first dielectric layer.

The method 900 includes a step 960 of filling the opening with a conductive material to form a second conductive component in the opening.

In some embodiments, before the forming of the first dielectric layer, a second dielectric layer is formed on the first ILD. The self-assembly layer prevents the second dielectric layer from being formed on the first conductive component, and the first dielectric layer is formed on the second dielectric layer. In some embodiments, the second dielectric layer is formed to have a lower dielectric constant than the first dielectric layer. The total parasitic capacitance of the semiconductor is lowered by the lower dielectric constant of the second dielectric layer, as well as the "elevation" of the first dielectric layer (which has a greater dielectric constant) since the first dielectric layer is formed on the second dielectric layer. In some embodiments, the second dielectric layer is formed to have a greater thickness than the first dielectric layer.

It is understood that additional process steps may be performed before, during, or after the steps 910-960 discussed above to complete the fabrication of the semiconductor device. For example, the method 900 may include a step of forming an etching stop layer over the conductive component and over the first ILD. The second ILD is formed over the etching stop layer.

For example, the method 900 may include the formation of source/drain regions and gate structures of a transistor before the step 910 is performed, and the formation of additional interconnect layers, packaging, and testing, after the step 960 is performed. Other steps may be performed but are not discussed herein in detail for reasons of simplicity.

In summary, the present disclosure forms a self-assembly layer on conductive elements (e.g., contacts, vias, or metal lines) of an interconnect layer. The self-assembly layer has a head group that has affinity to the conductive material such as metal but not to dielectric materials, and thus the self-assembly layer is not formed on the ILD that surrounds the conductive elements. Thereafter, a dielectric layer is formed, for example by a deposition process that uses precursors to form the dielectric layer. The self-assembly layer blocks the precursors from being deposited thereon, thereby causing the dielectric material to be formed on the ILD but not on the conductive elements. In this manner, the formation of the dielectric layer is "self-aligned" with the ILD. The material composition of the dielectric layer is configured such that a high etching selectivity exists between the dielectric layer and the ILD in an etching process (e.g., the ILD is etched substantially faster than the dielectric layer) performed later. In some embodiments, a stack of at least two dielectric layers is formed on the ILD, where a dielectric layer located at the bottom of the stack may have a lower dielectric constant than the dielectric layer located at the top of the stack.

Based on the above discussions, it can be seen that the present disclosure offers advantages over conventional devices and the fabrication thereof. It is understood, however, that other embodiments may offer additional advantages, and not all advantages are necessarily disclosed herein, and that no particular advantage is required for all embodiments.

One advantage is that the present disclosure alleviates problems caused by overlay shift. For example, a via hole may be etched in another ILD that is formed above the dielectric layer, where the via hole ideally should be aligned with the conductive element. However, due to an overlay shift, the via hole and the conductive element may be misaligned. Had the selectively-formed dielectric layer not been implemented, such a misalignment would cause a portion of the ILD located below the via hole to be inadvertently etched. This could cause reliability and/or performance problems such as breakdown voltage, time-dependent dielectric breakdown (TDDB), or leakage. Here, the dielectric layer serves as a self-aligned etching stop layer due to its location and high etching selectivity with the ILD. As a result, the dielectric layer protects portions of the ILD underneath from being undesirably etched in the via hole etching process, which in turn improves the reliability and/or performance of the semiconductor device herein.

Another advantage is associated with the embodiment where a stack of dielectric layers is formed on the ILD. The bottom dielectric layer in the stack has a low dielectric constant, which has a low contribution to the total parasitic capacitance. The upper dielectric layer in the stack may have a high dielectric constant, but its contribution to the total parasitic capacitance is also minimized since it is "elevated" by the lower dielectric layer, which means it is farther away from the electric field associated with the breakdown voltage. The reduction in total parasitic capacitance also improves the performance of the semiconductor device. Other advantages include compatibility with existing fabrication process flows, etc.

One aspect of the present disclosure involves a method of fabricating a semiconductor device. The method includes: providing a structure that includes a first conductive component and a first interlayer dielectric (ILD) that surrounds the first conductive component; selectively forming a self-assembly layer on the first conductive component; selectively forming a first dielectric layer over the first ILD; forming a second ILD over the first conductive component and over the first ILD; etching an opening in the second ILD, wherein the opening is at least partially aligned with the first conductive component, wherein the first dielectric layer protects portions of the first ILD located therebelow from being etched; and filling the opening with a conductive material to form a second conductive component in the opening.

One aspect of the present disclosure involves a semiconductor device. The semiconductor device includes: a first conductive component; a first interlayer dielectric (ILD) that surrounds the first conductive component; a first dielectric layer disposed over the first ILD, wherein the first dielectric layer has a greater dielectric constant than the first ILD; and a second conductive component disposed over, and at least partially aligned with, the first conductive component, wherein at least a portion of the first dielectric layer is disposed between the first ILD and the second conductive component.

Another aspect of the present disclosure involves a semiconductor device. The semiconductor device includes: a first metal element; a first interlayer dielectric (ILD) that surrounds the first metal element; a first dielectric layer disposed over the first ILD but not over the first metal element; a second dielectric layer disposed over the first dielectric layer, wherein the second dielectric layer has a greater dielectric constant than the first dielectric layer; a second ILD disposed over the second dielectric layer, wherein an etching selectivity exists between the second ILD and the second dielectric layer; and a second metal element extending vertically through the second ILD, wherein the second metal element is at least partially aligned with, and electrically coupled to, the first metal element, and wherein a portion of the first dielectric layer or a portion of the second dielectric layer is disposed between the second metal element and the first ILD.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first conductive component;
   a first interlayer dielectric (ILD) that surrounds the first conductive component;
   a first dielectric layer disposed over the first ILD, wherein the first dielectric layer has a greater dielectric constant than the first ILD;
   a second conductive component disposed over, and at least partially aligned with, the first conductive component, wherein at least a portion of the first dielectric layer is disposed between the first ILD and the second conductive component;
   a second ILD that surrounds the second conductive component, and wherein the first dielectric layer has a lower etching rate than the second ILD;
   an etching stop layer that is disposed between the first dielectric layer and the second ILD; and
   at least a portion of a self-assembly layer disposed between the first conductive component and the etching stop layer but not between the first conductive component and the second conductive component.

2. The semiconductor device of claim 1, further comprising: a second dielectric layer disposed between the first dielectric layer and the first ILD.

3. The semiconductor device of claim 2, wherein the second dielectric layer has a lower dielectric constant than the first dielectric layer.

4. The semiconductor device of claim 1, wherein:
   the first conductive component includes a via or a metal line of a first interconnect layer of a multilayer interconnect structure; and
   the second conductive component includes a via or a metal line of a second interconnect layer of the multilayer interconnect structure, the second interconnect layer being located above the first interconnect layer.

5. The semiconductor device of claim 1, wherein the self-assembly layer includes a head group that has an affinity with a metal material but not with dielectric materials.

6. The semiconductor device of claim 5, wherein the head group comprises phosphorous, sulfur, or silicon.

7. A semiconductor device, comprising:
   a first metal element;
   a first interlayer dielectric (ILD) that surrounds the first metal element;
   an entirety of a first dielectric layer disposed over the first ILD, wherein the entirety of the first dielectric layer is in direct contact with the first ILD but is not disposed over the first metal element, wherein a first side surface of the first dielectric layer is in physical contact with the first metal element, and wherein a second side surface of the first dielectric layer is in physical contact with an etching-stop layer;
   a second dielectric layer disposed over the entirety of the entire first dielectric layer, wherein the entirety of the first dielectric layer and the second dielectric layer have equal lateral dimensions;
   a second ILD disposed over the second dielectric layer, wherein an etching selectivity exists between the second ILD and the second dielectric layer; and
   a second metal element extending vertically through the second ILD, wherein the second metal element is at least partially aligned with, and electrically coupled to, the first metal element, and wherein a portion of the second dielectric layer is disposed directly below and in direct contact with the second metal element.

8. The semiconductor device of claim 7, wherein the second metal element is disposed on a first portion of an upper surface of the first metal element, and wherein the semiconductor device further comprises a self-assembly layer that is disposed over a second portion of the upper surface of the first metal element different from the first portion.

9. The semiconductor device of claim 8, further comprising an etching-stop layer disposed between the self-assembly layer and the second ILD.

10. The semiconductor device of claim 8, wherein the self-assembly layer is arranged into a plurality of strands, and wherein each of the strands includes a head group and a tail group.

11. The semiconductor device of claim 10, wherein the head group has an affinity with a surface of a metal material but not with dielectric materials.

12. The semiconductor device of claim 10, wherein the head group contains phosphorous, sulfur, or silicon, or combinations thereof.

13. The semiconductor device of claim 10, wherein the tail group includes an organic material.

14. The semiconductor device of claim 10, wherein each of the strands extends in a direction facing away from an upper surface of the first metal element.

15. The semiconductor device of claim 7, wherein the first dielectric layer has a dielectric constant that is less than about 6, and wherein the second dielectric layer has a dielectric constant that is greater than about 13.

16. The semiconductor device of claim 7, wherein no metal elements are disposed directly below the first dielectric layer.

17. A semiconductor device, comprising:
a first metal component;
a first interlayer dielectric (ILD) that surrounds the first metal component, wherein the first ILD and the first metal component have co-planar upper surfaces;
a first dielectric layer disposed over the first ILD; and
a second metal component disposed over a first portion of the first metal component;
a self-assembly layer disposed over a second portion of the first metal component, the second portion being different from the first portion, wherein a bottom surface of the self-assembly layer is in direct contact with an upper surface of the second portion of the first metal component;
an etching stop layer disposed over the first ILD, over the first dielectric layer, and over the self-assembly layer; and
a second ILD disposed over the etching stop layer, wherein the second ILD surrounds the second metal component.

18. The semiconductor device of claim 17, wherein:
the self-assembly layer is arranged into a plurality of strands that extend away from an upper surface of the first metal component;
each of the strands includes a head group and a tail group; and
the head group has an affinity with the first metal component but not with the first ILD.

19. The semiconductor device of claim 18, wherein:
the head group contains phosphorous, sulfur, or silicon, or combinations thereof; and
the tail group includes an organic material.

20. The semiconductor device of claim 17, wherein the second metal component is mis-aligned with the first metal component.

* * * * *